United States Patent
Yu et al.

(10) Patent No.: US 8,368,180 B2
(45) Date of Patent: Feb. 5, 2013

(54) SCRIBE LINE METAL STRUCTURE

(75) Inventors: Chen-Hua Yu, Hsin-Chu (TW);
Shin-Puu Jeng, Hsin-Chu (TW);
Hao-Yi Tsai, Hsin-Chu (TW);
Shang-Yun Hou, Jubei (TW);
Hsien-Wei Chen, Sinying (TW);
Ming-Yen Chiu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 246 days.

(21) Appl. No.: 12/619,464

(22) Filed: Nov. 16, 2009

(65) Prior Publication Data
US 2010/0207251 A1  Aug. 19, 2010

Related U.S. Application Data

(60) Provisional application No. 61/153,439, filed on Feb. 18, 2009.

(51) Int. Cl.
*H01L 23/544*  (2006.01)

(52) U.S. Cl. ......... 257/620; 257/E23.179; 257/E21.001; 438/462

(58) Field of Classification Search .............. 257/620, 257/E23.179, E21.001; 438/462
See application file for complete search history.

(56) References Cited

U.S. PATENT DOCUMENTS

| | | | |
|---|---|---|---|
| 5,047,711 A | 9/1991 | Smith et al. | |
| 5,096,855 A | 3/1992 | Vokoun, III | |
| 5,136,364 A | 8/1992 | Byrne | |
| 5,206,181 A | 4/1993 | Gross | |
| 5,239,191 A | 8/1993 | Sakumoto et al. | |
| 5,285,082 A | 2/1994 | Axer | |
| 5,371,411 A | 12/1994 | Hara et al. | |
| 5,751,065 A | 5/1998 | Chittipeddi et al. | |
| 5,831,330 A | 11/1998 | Chang | |
| 5,834,829 A | 11/1998 | Dinkel et al. | |
| 6,022,791 A | 2/2000 | Cook et al. | |
| 6,114,766 A | 9/2000 | Shields | |
| 6,121,677 A | 9/2000 | Song et al. | |
| 6,300,223 B1 | 10/2001 | Chang et al. | |
| 6,350,622 B2 | 2/2002 | Misewich et al. | |
| 6,358,839 B1 | 3/2002 | Li et al. | |
| 6,365,958 B1 | 4/2002 | Ibnabdeljalil et al. | |

(Continued)

FOREIGN PATENT DOCUMENTS

| CN | 1542505 A | 11/2004 |
|---|---|---|
| CN | 1701418 A | 11/2005 |

(Continued)

OTHER PUBLICATIONS

Pidin, S., et al., "MOSFET Current Drive Optimization Using Silicon Nitride Capping Layer for 65-nm Technology Node," 2004 Symposium on VLSI Technology Digest of Technical Papers, IEEE, pp. 54-55.

(Continued)

*Primary Examiner* — Marc Armand
(74) *Attorney, Agent, or Firm* — Slater & Matsil, L.L.P.

(57) ABSTRACT

A system and method for preventing defaults during singulation is presented. An embodiment comprises a dummy metal structure located in the scribe region. The dummy metal structure comprises a series of alternating dummy lines that are connected through dummy vias. The dummy lines are offset from dummy lines in adjacent metal layers. Additionally, the dummy lines and dummy vias in the upper layers of the scribe line may be formed with larger dimensions than the dummy lines and dummy vias located in the lower layers.

18 Claims, 8 Drawing Sheets

U.S. PATENT DOCUMENTS

| | | | |
|---|---|---|---|
| 6,384,463 B1 | 5/2002 | Miles et al. |
| 6,483,173 B2 | 11/2002 | Li et al. |
| 6,492,716 B1 | 12/2002 | Bothra et al. |
| 6,495,918 B1 | 12/2002 | Brintzinger |
| 6,521,975 B1 | 2/2003 | West et al. |
| 6,566,736 B1 | 5/2003 | Ogawa et al. |
| 6,605,861 B2 | 8/2003 | Toyoda |
| 6,796,024 B2 | 9/2004 | Katoh et al. |
| 6,806,168 B2 | 10/2004 | Towle et al. |
| 6,841,455 B2 | 1/2005 | West et al. |
| 6,861,754 B2 | 3/2005 | Lin et al. |
| 6,861,755 B2 | 3/2005 | Hosoda et al. |
| 6,876,062 B2 | 4/2005 | Lee et al. |
| 6,876,064 B2 | 4/2005 | Matumoto et al. |
| 6,876,946 B2 | 4/2005 | Yasuda et al. |
| 6,939,736 B2 | 9/2005 | Grabham et al. |
| 6,963,389 B2 | 11/2005 | Fukada |
| 6,998,712 B2 | 2/2006 | Okada et al. |
| 7,042,099 B2 | 5/2006 | Kurashima et al. |
| 7,087,452 B2 | 8/2006 | Joshi et al. |
| 7,126,225 B2 | 10/2006 | Su et al. |
| 7,126,255 B2 | 10/2006 | Yamaguchi et al. |
| 7,129,565 B2 | 10/2006 | Watanabe et al. |
| 7,129,566 B2 | 10/2006 | Uehling et al. |
| 7,135,384 B2 | 11/2006 | Takyu et al. |
| 7,138,297 B2 | 11/2006 | Iijima et al. |
| 7,138,700 B2 | 11/2006 | Tomita et al. |
| 7,145,211 B2 | 12/2006 | Mallikarjunaswamy et al. |
| 7,235,834 B2 | 6/2007 | Fukada |
| 7,235,864 B2 | 6/2007 | Lee |
| 7,259,445 B2 | 8/2007 | Lau et al. |
| 7,291,874 B2 | 11/2007 | Hsu |
| 7,294,937 B2 | 11/2007 | Su et al. |
| 7,335,577 B2 | 2/2008 | Daubenspeck et al. |
| 7,387,950 B1 | 6/2008 | Kuo et al. |
| 7,400,028 B2 | 7/2008 | Tomita |
| 7,407,835 B2 | 8/2008 | Chuang |
| 7,456,507 B2 | 11/2008 | Yang |
| 7,566,915 B2 | 7/2009 | Chang et al. |
| 7,646,078 B2 | 1/2010 | Jeng et al. |
| 7,763,887 B2 | 7/2010 | Han |
| 2001/0005617 A1 | 6/2001 | Feurle et al. |
| 2001/0008296 A1 | 7/2001 | Gelsomini et al. |
| 2002/0024115 A1 | 2/2002 | Ibnabdeljalil et al. |
| 2002/0130394 A1* | 9/2002 | Toyoda ............ 257/618 |
| 2003/0003677 A1 | 1/2003 | Fukada |
| 2004/0084777 A1 | 5/2004 | Yamanoue et al. |
| 2004/0119164 A1 | 6/2004 | Kurashima et al. |
| 2004/0150070 A1 | 8/2004 | Okada et al. |
| 2004/0150073 A1 | 8/2004 | Matumoto et al. |
| 2005/0009300 A1 | 1/2005 | Murari et al. |
| 2005/0026397 A1 | 2/2005 | Daubenspeck et al. |
| 2005/0098893 A1 | 5/2005 | Tsutsue et al. |
| 2005/0148115 A1 | 7/2005 | Williams et al. |
| 2005/0230005 A1 | 10/2005 | Liang et al. |
| 2005/0269702 A1 | 12/2005 | Otsuka |
| 2005/0280120 A1 | 12/2005 | Tomita |
| 2006/0012012 A1 | 1/2006 | Wang et al. |
| 2006/0022195 A1 | 2/2006 | Wang |
| 2006/0055002 A1 | 3/2006 | Yao et al. |
| 2006/0055007 A1 | 3/2006 | Yao et al. |
| 2006/0125090 A1 | 6/2006 | Chen et al. |
| 2006/0172457 A1 | 8/2006 | Huang |
| 2006/0192265 A1 | 8/2006 | Hsu |
| 2007/0018331 A1* | 1/2007 | Chen ............ 257/774 |
| 2007/0090447 A1 | 4/2007 | Morimoto et al. |
| 2007/0090547 A1 | 4/2007 | Su et al. |
| 2008/0213938 A1 | 9/2008 | Kao |
| 2008/0265378 A1 | 10/2008 | Lee et al. |
| 2008/0283969 A1 | 11/2008 | Jeng et al. |
| 2009/0115024 A1 | 5/2009 | Jeng et al. |
| 2009/0115025 A1* | 5/2009 | Jung ............ 257/620 |
| 2009/0321890 A1 | 12/2009 | Jeng et al. |
| 2010/0123219 A1 | 5/2010 | Chen et al. |

FOREIGN PATENT DOCUMENTS

| | | |
|---|---|---|
| CN | 1770432 A | 5/2006 |
| CN | 1830079 A | 9/2006 |
| CN | 1956173 A | 5/2007 |

OTHER PUBLICATIONS

"Motorola MC7457RX1000NB Microprocessor," Sample Prep Delamination, Motorola Chipworks, Mar. 15, 2005, 1 p., Figure 3.1.3 Die Seal.

* cited by examiner

SCRIBE LINE METAL STRUCTURE

This application claims the benefit of U.S. Provisional Patent Application Ser. No. 61/153,439, filed on Feb. 18, 2009, and entitled "Scribe Line Metal Structure," which application is incorporated herein by reference.

TECHNICAL FIELD

The present invention relates generally to a system and method for manufacturing semiconductor devices and, more particularly, to improving the quality of dicing when dicing semiconductor dies.

BACKGROUND

In the manufacturing of semiconductor devices, integrated circuit dies are formed on a wafer and then separated from the wafer using a saw. Generally, sufficient space is left between adjacent dies to allow for the width of a saw blade during cutting. This space between the dies is referred to as a scribe line, and usually contains test structures used to verify the properties of the die.

Unfortunately, the physical process of sawing the wafer may damage the physical structure of the dies. For example, the saw could crack the silicon crystal of the wafer, and these cracks could then propagate through the dies. The saw may also cause a partial or complete delamination of the dies, essentially pulling off some of the layers that have been deposited onto the wafer. Additionally, the test structures, which could be located in the scribe line itself, can also cause cracking when the die is cut. Damage such as this would render the dies unusable and ruin the commercial value of the dies.

One attempt to contain cracks and delamination is to use dummy metal structures in the scribe line. These dummy metal structures are normally used to balance the metal density during chemical mechanical polishing (CMP). However, when they are used appropriately, they can act as a precipitate in order to stop dislocation movement, and prevent cracks and delamination from spreading. These dummy metal structures could be placed all around the die, or else they could be placed in areas where potential cracking would be concentrated, such as the corners of the die.

In cross section, the dummy metal structures can comprise various metal layers and vias in different dielectric layers over the semiconductor substrate. However, this form of dummy metal structure does not sufficiently protect the die from damage during the sawing process.

SUMMARY OF THE INVENTION

These and other problems are generally solved or circumvented, and technical advantages are generally achieved, by various embodiments of the present invention which help to prevent cracking and delamination of semiconductor dies when the dies are cut from the wafer.

In accordance with an embodiment of the present invention, a semiconductor device comprises a substrate with a scribe region and a plurality of conductive layers and dielectric layers over the substrate, the plurality of conductive layers and dielectric layers comprising an upper area and a lower area. A dummy structure is located within the plurality of conductive layers, and the dummy structures comprise a plurality of dummy lines located in separate conductive layers. A first one of the plurality of dummy lines is located in the upper area and a second one of the first plurality of dummy lines is located in the lower area. One or more vias connect individual ones of the plurality of dummy lines to at least one other dummy line in a separate conductive layer. The first one of the plurality of dummy lines has a larger dimension than the second one of the plurality of dummy lines.

In accordance with another embodiment of the present invention, a semiconductor device comprises a plurality of semiconductor dies on a wafer and a scribe region located between individual ones of the plurality of semiconductor dies, the scribe region comprising at least a first conductive layer and a second conductive layer. A first plurality of separate dummy lines are located in an array in the first conductive layer and a second plurality of separate dummy lines are located in an array in the second conductive layer, and the second plurality of separate dummy lines is laterally offset from the first plurality of separate dummy lines. At least one via extends from individual ones of the first plurality of separate dummy lines to individual ones of the second plurality of separate dummy lines.

In accordance with yet another embodiment of the present invention, a method for preventing damage during scribing comprises providing a substrate with a scribe region and forming an array of dummy structures across the scribe region. Forming the array of dummy structures comprises forming a first plurality of dummy lines over the scribe region, where individual ones of the first plurality of dummy lines are located at different distances from the substrate and are laterally offset from adjacent ones of the first plurality of dummy lines. One or more vias are formed between individual ones of the first plurality of dummy lines.

An advantage of an embodiment of the present invention is that the dummy metal structures will enhance the strength of the individual layers. This allows the layers to withstand more stresses prior to delamination, thereby reducing or preventing damage caused by separating dies from a wafer. This would lead to less dies rejected and an overall greater yield.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely a scribe line dummy metal structure to prevent damage during dicing operations. The invention may also be applied, however, to other dicing operations where cracking and defects are a problem.

Figure 1A:
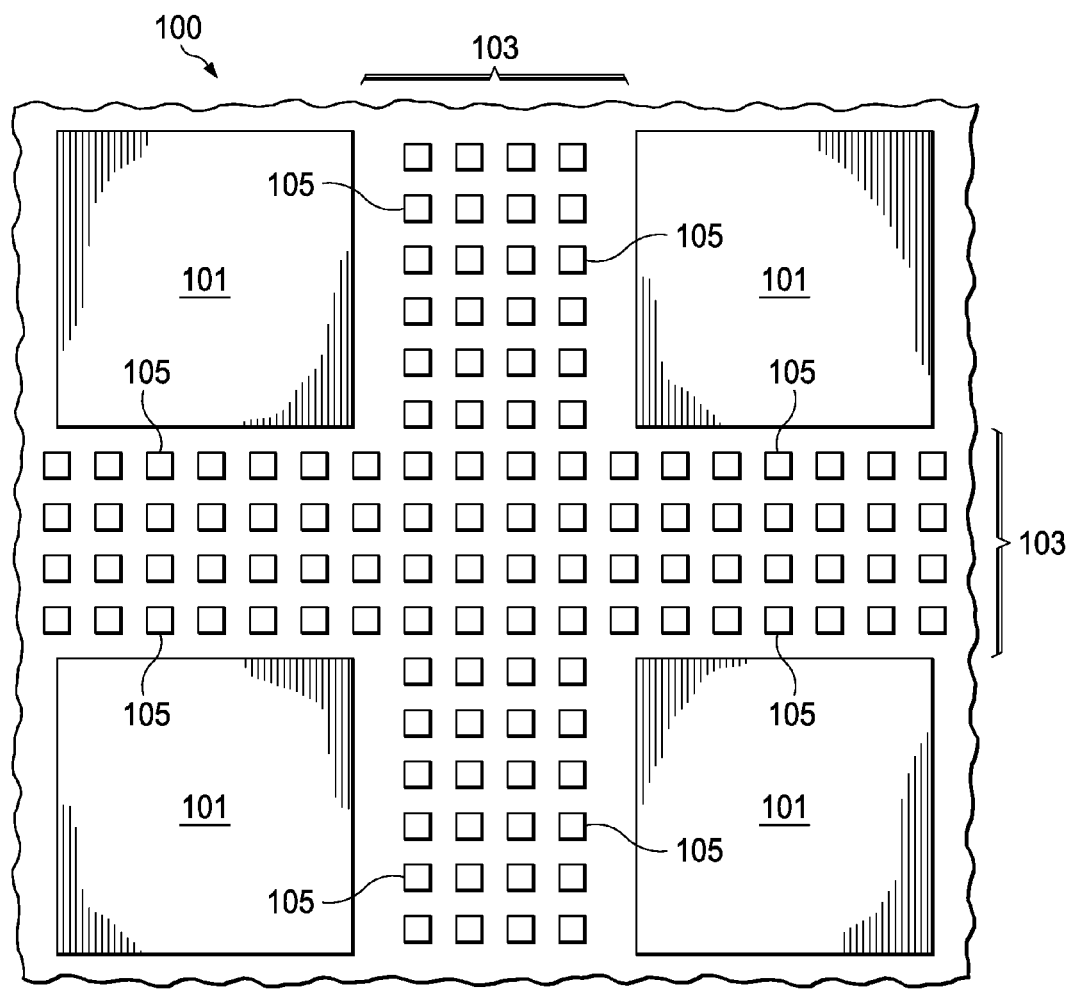
FIGS. 1A-1B illustrate plan views of dummy metal structure layouts in accordance with an embodiment of the present invention.

With reference now to FIG. 1A, there is shown an embodiment of the present invention comprising a plurality of individual dies 101 on a wafer 100, wherein each die 101 includes a substrate (not shown) having electronic devices formed thereon as is known in the art. The substrate is typically covered with one or more dielectric layers 204 (not visible in FIG. 1A but illustrated and described with respect to FIG. 2B below) and one or more metal layers 202 between adjacent dielectric layers 204 (not visible in FIG. 1A but illustrated and described with respect to FIG. 2B below). The metal layers 202 provide connectivity and routing for the underlying electronic devices. There could be any number of alternating layers of metal layers 202 and dielectric layers 204 located on the die 101, but a typical range of layers would be from three layers to twelve layers of alternating metal layers 202 and dielectric layers 204.

Separating the individual dies 101 are scribe lines 103, which form an area for a saw to be used to separate the die 101 from the wafer 100. In an embodiment, scribe lines 103 run substantially parallel to the edges of the individual dies 101. Accordingly, the scribe lines 103 intersect each other at the corners of the dies 101 to form a junction region.

The scribe lines 103 are formed by not placing functional structures (structures that will be used by the die 101 once it has been cut from the wafer) into the area intended for the scribe line 103. Other structures, such as test pads or dummy metals used for planarization, could be placed into the scribe line 103, but would not be necessary for the functioning of the die 101 once the die 101 has been cut from the wafer 100. The scribe lines 103 have a width of between about 20 μm and about 180 μm, such as about 80 μm.

Within the scribe lines 103 are placed a plurality of dummy structures 105 (only the tops of which can be seen below in FIG. 2A). In this embodiment the dummy structures 105, when viewed in a plan view as below in FIG. 2A, are aligned with each other along straight lines substantially parallel with the sides of the dies 101.

Figure 1B:
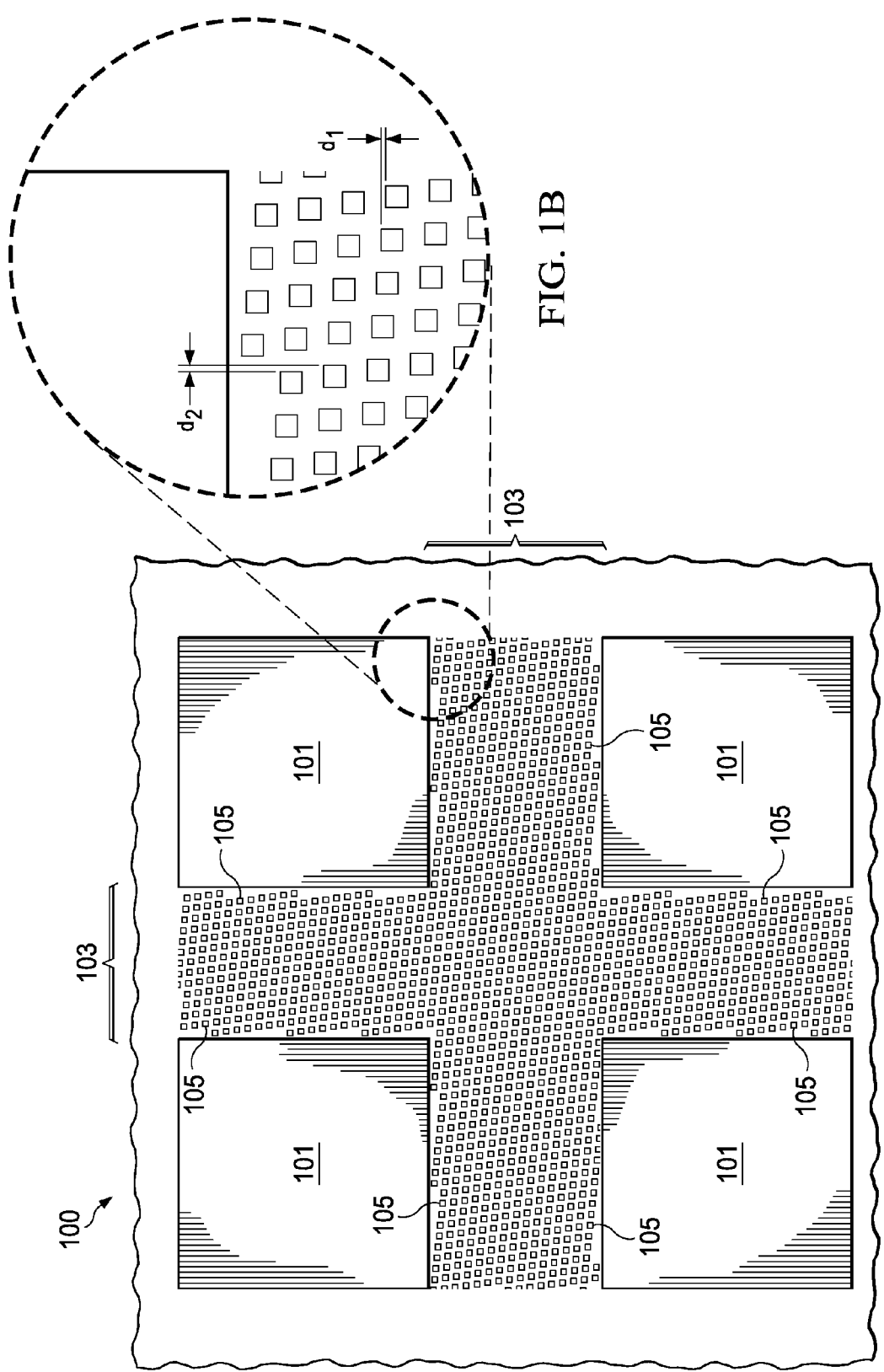

FIG. 1B illustrates another embodiment in which the dummy structures 105 are placed into an array wherein each dummy structure 105 is offset from adjacent dummy structures 105. In this embodiment each dummy structure 105 is offset from adjacent dummy structures 105 in a first direction a first distance $d_1$ between about 0.1 μm and about 2 μm, such as about 0.7 μm. Additionally, in a second direction perpendicular to the first direction, each dummy structure 105 is offset from adjacent dummy structures 105 a second distance $d_2$ between about 0.1 μm and about 2 μm, such as about 0.7 μm. However, the layouts discussed above with reference to FIGS. 1A-1B are meant to be merely illustrative and are not meant to limit the layout of the dummy structures 105, and all suitable layouts are fully intended to be included within the scope of the present invention.

Figure 2A:
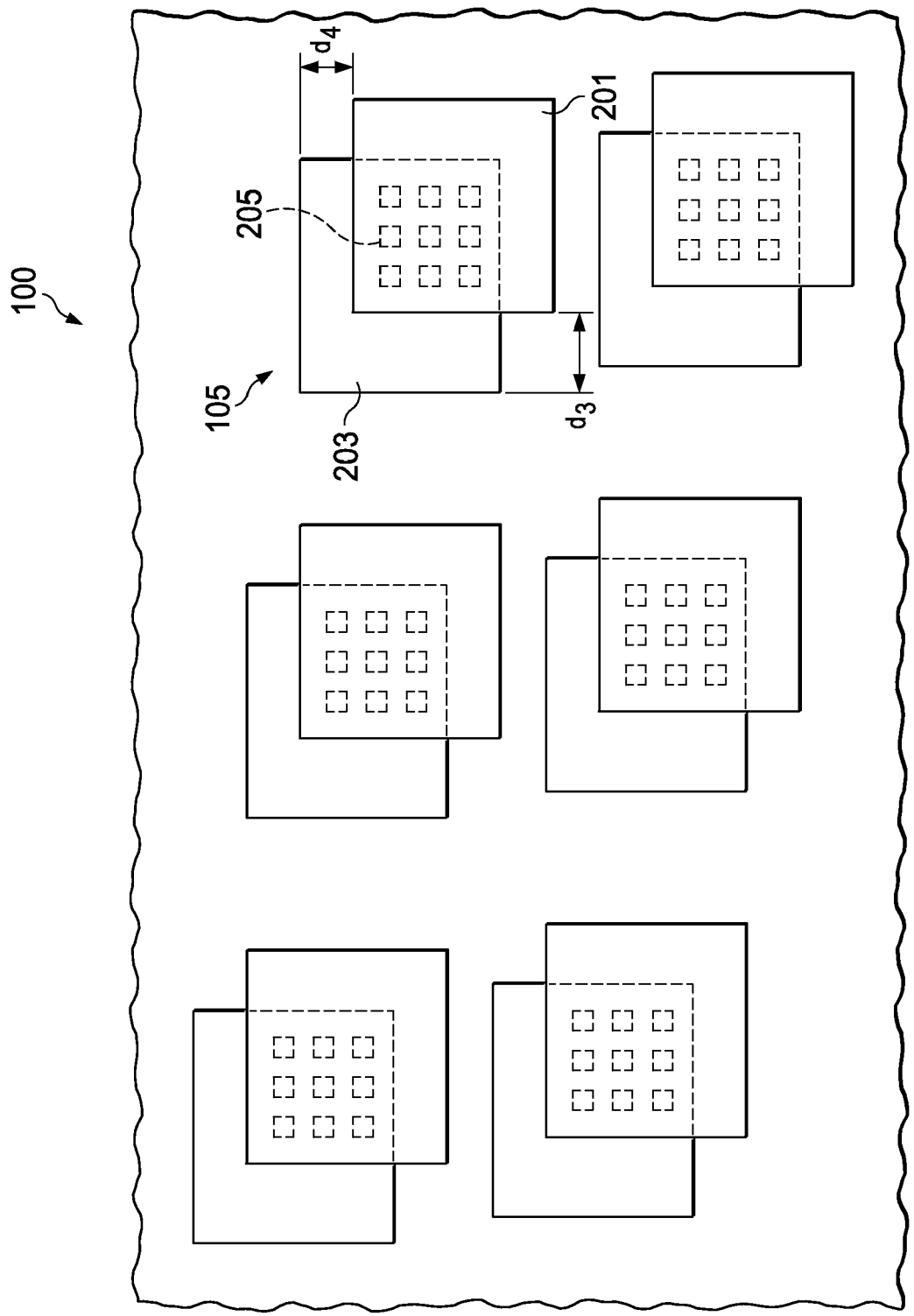
FIGS. 2A-2B illustrate a plan view and a cross-sectional view, respectively, of dummy metal structures in accordance with an embodiment of the present invention.

FIG. 2A illustrates a close-up plan view of the top two layers of six individual dummy structures 105. Each of the dummy structures 105 comprises a first dummy line 201 and a second dummy line 203 located in the next conductive metal layer 202 further into the wafer 100 than the first dummy line 201. First vias 205 connect the first dummy line 201 and the second dummy line 203.

In this embodiment the first dummy lines 201 are square in shape and have a side length of between about 0.1 μm and about 15 μm, such as about 0.7 μm, and a thickness of between about 0.5 μm and about 20 μm, such as about 1 μm. Further, the first dummy lines 201 may have a pitch between adjacent first dummy lines 201 of between about 0.2 μm and about 30 μm, such as about 1.2 μm, which gives a density of the first dummy lines 201 (i.e., the amount of surface area of the top dummy line 201 versus the total area in the scribe line) of between about 15% and about 40%, such as a first dummy line 201 density of about 33%. However, other shapes and dimensions may alternatively be used.

The second dummy line 203 may have a similar size and shape as the first dummy line 201 (e.g., a square shape about 0.7 μm on a side), and also may have a pitch in relation to adjacent second dummy line 203 similar to the pitch of the first dummy lines 201 (e.g., a pitch of about 1.2 μm). In this embodiment the second dummy line 203 may be laterally offset from the first dummy line 201 a third distance $d_3$ and a fourth distance $d_4$ between about 15% and about 35% of the side length of the second dummy line 203, such as about 25% of the side length of the second dummy line 203. For example, if the second dummy line 203 is about 0.7 μm on a side, the lateral offset in each direction may be about 0.16 μm.

The first vias 205 connect the first dummy line 201 and the second dummy line 203, and are located in an area of the first dummy line 201 that overlaps the second dummy line 203. In this embodiment there are a number of first vias 205, such as nine first vias 205, connecting the first dummy line 201 and the second dummy line 203, with the first vias 205 arranged in an 3×3 array pattern. The individual first vias 205 are formed in a square shape, with each side of the square being between about 0.03 μm and about 0.5 μm, such as about 0.12 μm. Further, the first vias 205 have a pitch of between about 0.06 μm and about 1 μm, such as about 0.24 μm, to give a dummy metal via density of about 4.4%. However, any desired number, shape, or size of the first vias 205 may alternatively be used.

Figure 2B:
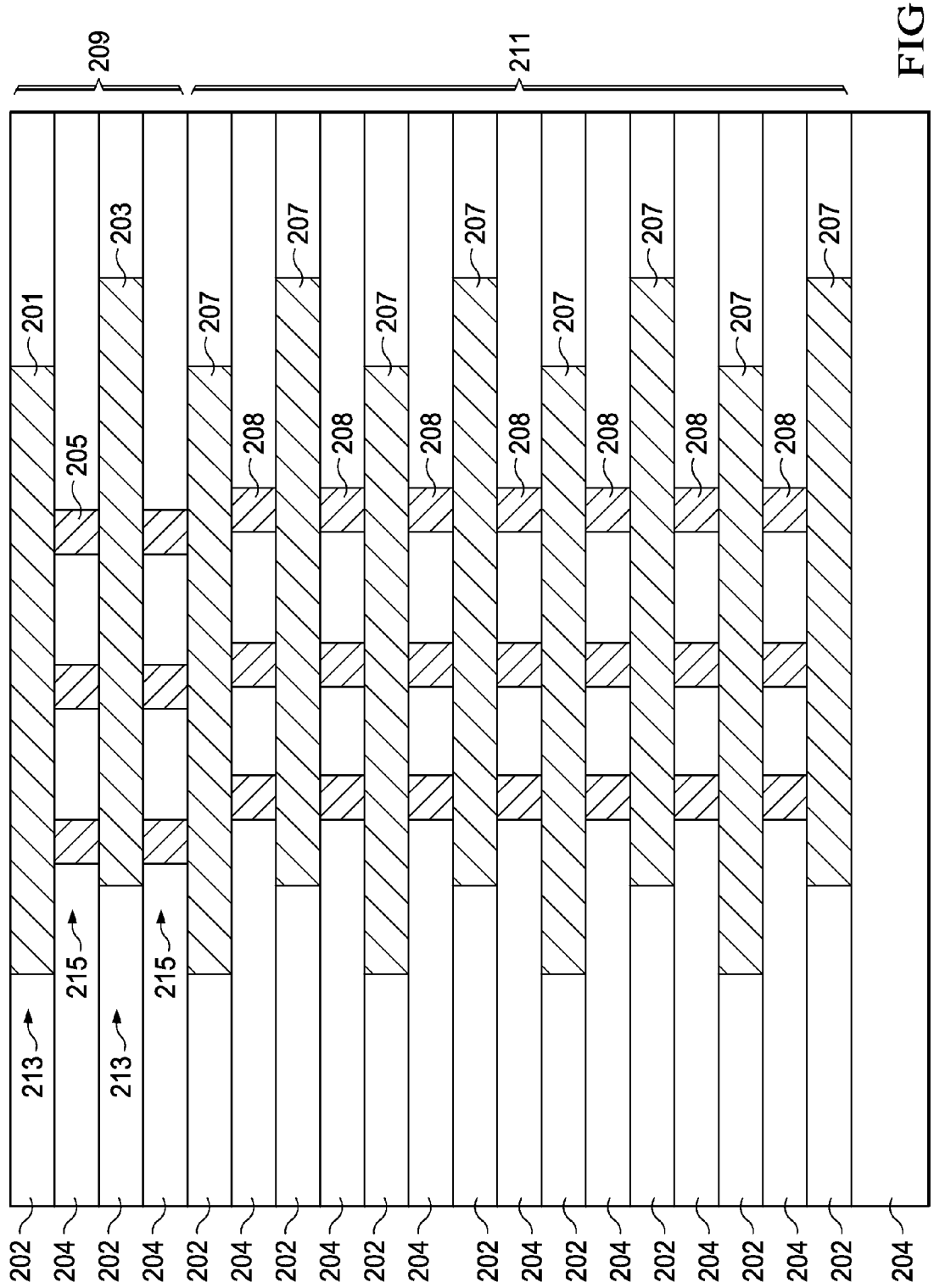

FIG. 2B illustrates a cross sectional view of an individual dummy structure 105. As illustrated, each individual dummy structure 105 comprises a number of upper layers 209 and a number of lower layers 211. Additionally, the upper layers 209 of the dummy structure 105 include upper layer dummy lines 213 (which for clarity have been illustrated to include both the first dummy line 201 and the second dummy line 203) attached to upper layer vias 215 (e.g., first vias 205) while the lower layers 211 include lower layer dummy lines 207 attached to lower layer vias 208. The upper layer dummy lines 213 and the lower layer dummy lines 207 may be formed in the corresponding metal layers 202 of the dies, and the upper layer vias 215 and the lower layer vias 208 may be formed in the interlayer dielectric layers 204 of the dies.

In this embodiment the upper layer dummy lines 213 and the lower layer dummy lines 207 are each laterally offset from adjacent dummy lines such that an alternating offset pattern is formed. The number of alternating dummy lines (including the upper layer dummy lines 213 and the lower layer dummy lines 207) in this embodiment corresponds to the number of metal layers 202 in the die 101 adjacent to the scribe line. For example, a die 101 (not shown in FIG. 2B but illustrated in FIGS. 1A and 1B) that has ten metal layers 202 would have ten dummy lines and their connecting vias. However, any number of dummy lines (for example, two dummy metal lines) may be beneficially used with any number of layers in the die 101, as long as the dummy lines are formed in adjacent metal layers 202 to each other.

The upper layer dummy lines 213, lower layer dummy lines 207, upper layer vias 215, and lower layer vias 208 may be formed at the same time and in a similar fashion as the various metal layers 202 and interconnections of the adjacent dies 101 (shown in FIGS. 1A-1B). For example, the upper layer dummy lines 213, lower layer dummy lines 207, upper layer vias 215 and lower layer vias 208 may be formed by initially forming a dielectric layer and then using a dual damascene process to form the upper layer dummy lines 213, lower layer dummy lines 207, upper layer vias 215, and lower layer vias 208 from a metal such as copper, as is known in the art. However, any suitable process for forming the upper layer dummy lines 213, lower layer dummy lines 207, upper layer vias 215, and lower layer vias 208 and any material that would assist in absorbing stresses, may alternatively be used.

Additionally, in this embodiment, the upper layer vias 215 (e.g., the first vias 205) have larger dimensions than the lower layer vias 208. For example, in an embodiment in which the upper layer vias 215 have a side length of 0.4 µm, the lower layer vias 208 may have a side dimension of between about 0.03 µm and about 0.5 µm, such as about 0.12 µm. Additionally, the lower layer vias 208 may have a pitch of between about 0.06 µm and about 1 µm, such as about 0.24 µm.

Figure 3A:
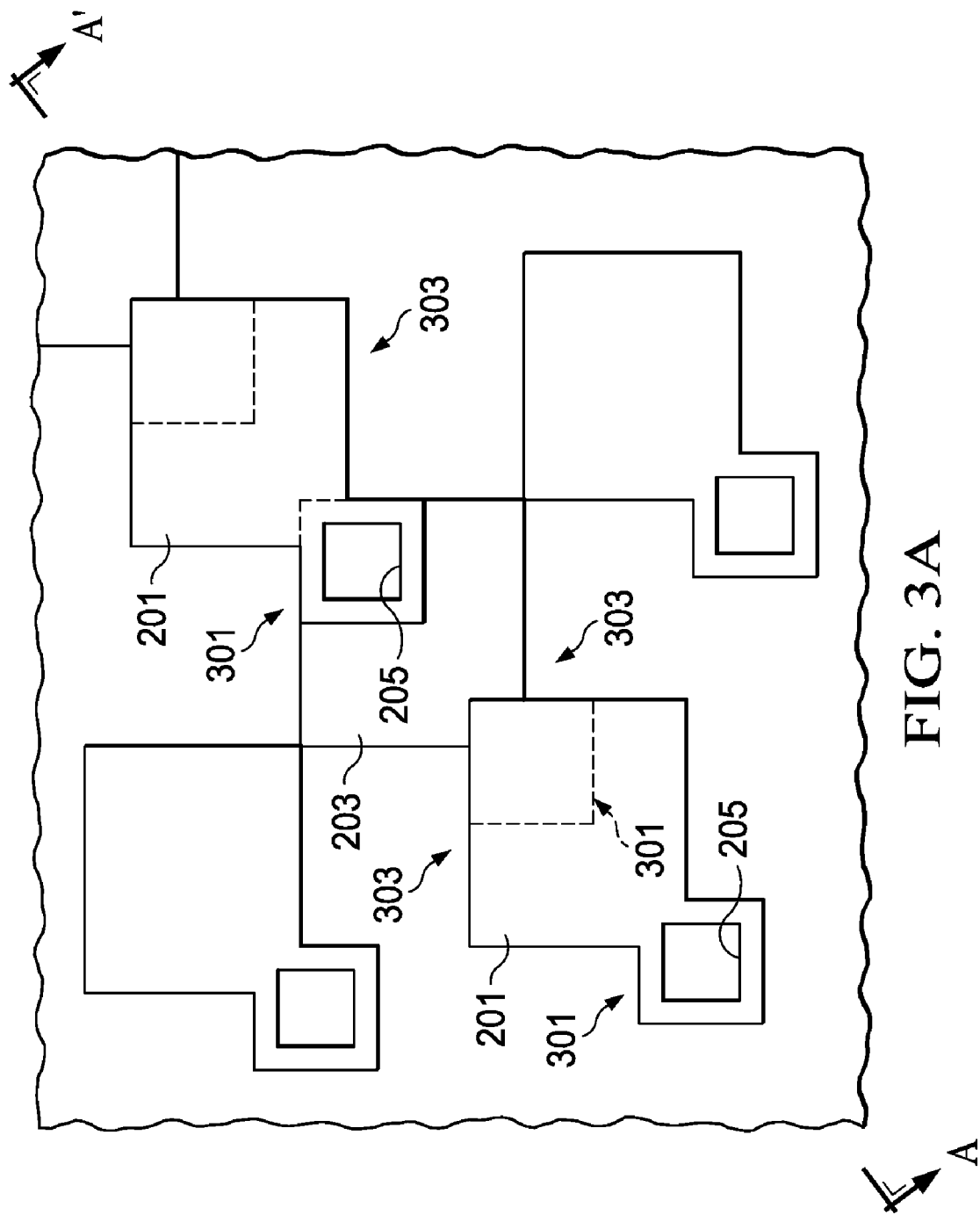
FIGS. 3A-3B illustrate a plan view and a cross-sectional view, respectively, of dummy metal structures with a square-shaped extension in accordance with an embodiment of the present invention.
Figure 3B:
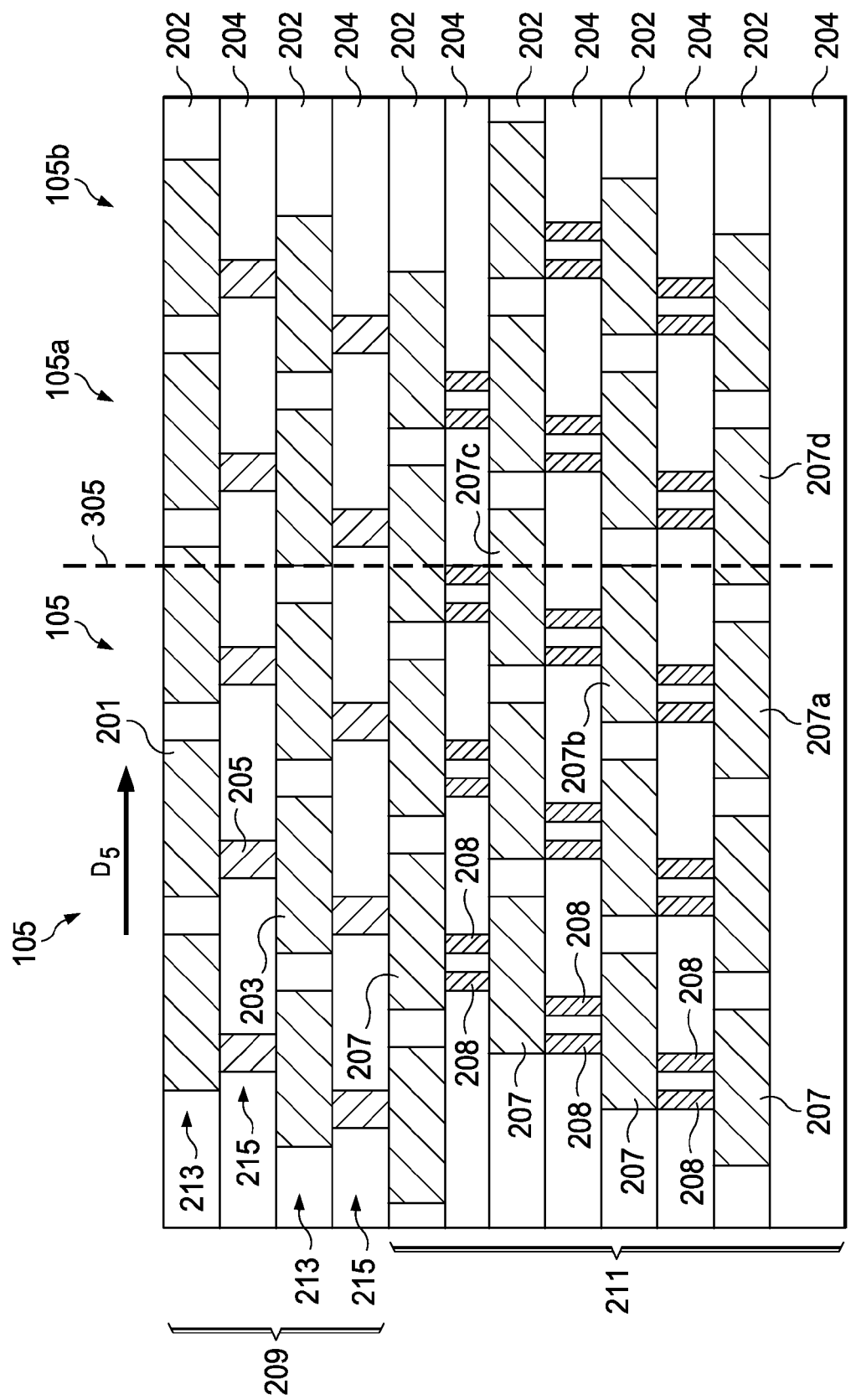

FIGS. 3A and 3B illustrate a plan view and cross sectional view, respectively, of another embodiment of the present invention, wherein FIG. 3B illustrates a cross sectional view of FIG. 3A along aline A-A'. In this embodiment the first dummy line 201 and the second dummy line 203 have the shape of a main square 303 with another square-shaped extension 301 extending from one corner. In this embodiment the main square 303 has side lengths of between about 0.2 µm and about 15 µm, such as a side length of about 0.6 µm, while the square extension 301 has a side length of between about 0.1 µm and about 7.5 µm, such as a side length of about 0.3 µm. The square-shaped extension 301 extends from the main square 303 with about three-quarters of its area, to form the shape illustrated in FIG. 3A, and the square-shaped extension 301 of the first dummy line 201 also overlies the main square 303 of the underlying second dummy line 203.

In this embodiment the first via 205 connected to the square-shaped extension 301 of the first dummy line 201 extends downwards to land on the main square 303 of the second dummy line 203. Accordingly, while not shown in FIG. 3A because FIG. 3A illustrates only the first dummy line 201 and the second dummy line 203, upper layer vias 215 and lower layer vias 208 that extend to lower dummy lines extend from the square-shaped extension 301, while upper layer vias 215 and lower layer vias 208 that extend to a higher dummy line extend from the main square 303 of the dummy line.

Additionally, in this embodiment the upper layer vias 215 comprise a single first via 205 between the first dummy line 201 and the second dummy line 203. This single first via 205 may be square in shape and have a side length of between about 0.03 µm and about 0.5 µm, such as a side length of about 0.12 µm.

Additionally, similar to the embodiment described above with reference to FIG. 2B, the lower layer vias 208 may have a smaller dimension than the upper layer vias 215, which helps to reinforce the mechanical strength of the layers while still remaining within suitable design rules. For example, instead of a single large via similar to the upper layer vias 215, the lower layer vias 208 may comprise four smaller vias arranged in a 2×2 array. These lower layer vias 208 may be square in shape and have a side length of between about 0.03 µm and about 0.5 µm, such as a side length of about 0.12 µm.

These lower layer vias 208 may also have a pitch between themselves of between about 0.06 µm and about 1 µm, such as a pitch of about 0.24 µm.

Due to the connections of the upper layer vias 215 and the lower layer vias 208 as described above with respect to FIG. 3A, the upper layer dummy lines 213 and the lower layer dummy lines 207 ascend from the lower most lower layer dummy lines 207 to the first dummy line 201 in a stair-step fashion. Taking one of the dummy structures 105a as an example, a first lower layer dummy line 207b overlies but is offset from a second lower layer dummy line 207a in a first direction (illustrated in FIG. 3B by arrow $D_1$). Further, a third lower layer dummy line 207c overlies the second lower layer dummy line 207b while being offset from the second lower layer dummy line 207b in the same first direction $D_1$. This offsetting structure continues through each of the metal layers 202 to form the stair-step structure as illustrated in FIG. 3B, and also causes layers of one dummy structure 105a (e.g., first lower layer dummy line 207c) to overlie layers of a separate second dummy structure 105 (e.g., lower layer dummy line 207d) as illustrated by the dotted line 305.

Figure 4A:
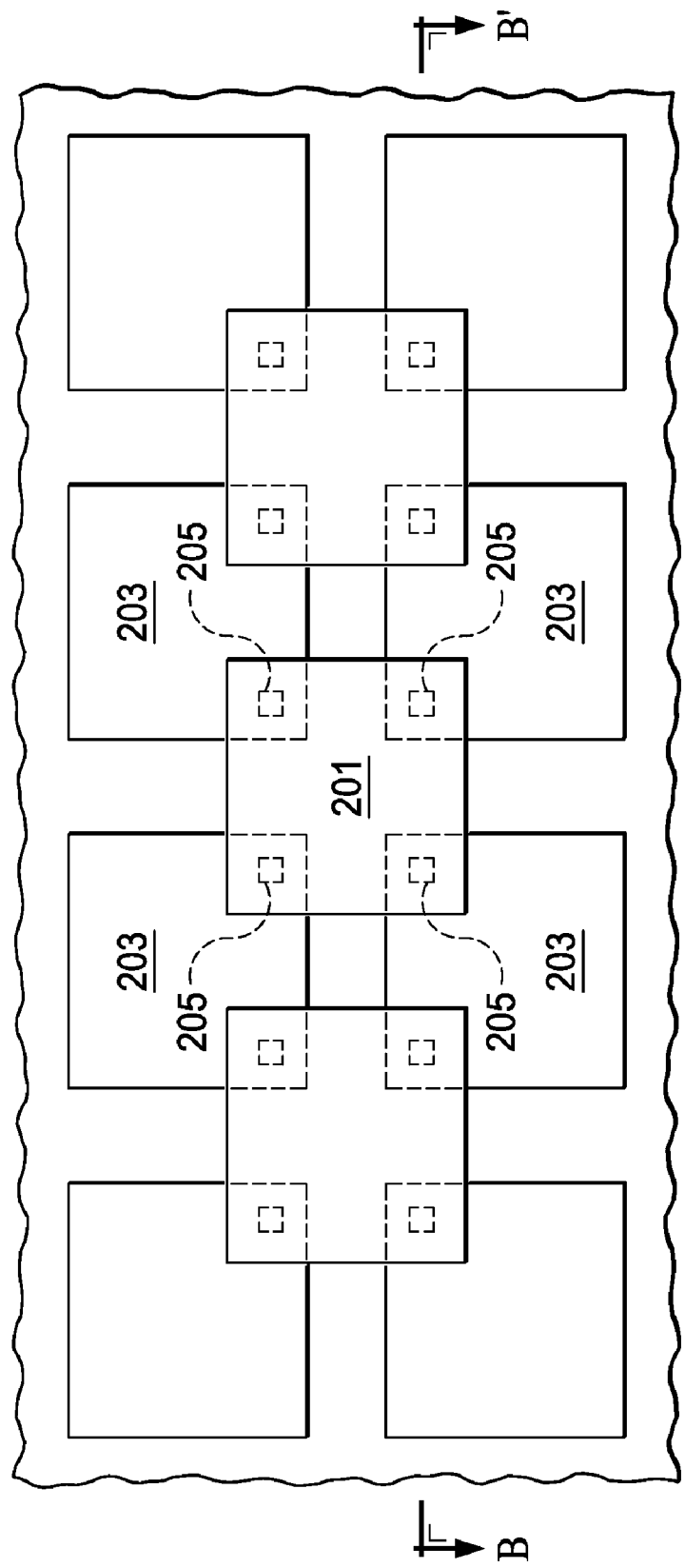
FIGS. 4A-4B illustrate a plan view and a cross-sectional view, respectively, of a first dummy metal structure being connected to multiple second dummy metal structures in accordance with an embodiment of the present invention.

FIG. 4A illustrates yet another embodiment of the present invention in which each of the first dummy lines 201 is separately connected to four separate second dummy lines 203 in a net type pattern. In this embodiment each of the four corners of the first dummy line 201 overlies a corner of a second dummy line 203 located below it. The first dummy line 201 overlies each of the second dummy lines 203 with between about 5% and about 20% of the area of the first dummy line 201. A first via 205 extends from each corner of the first dummy line 201 to a corner of each of the underlying second dummy lines 203. In this embodiment the first dummy line 201 is square in shape with a side length of between about 0.1 µm and about 15 µm, such as about 0.7 µm.

Figure 4B:
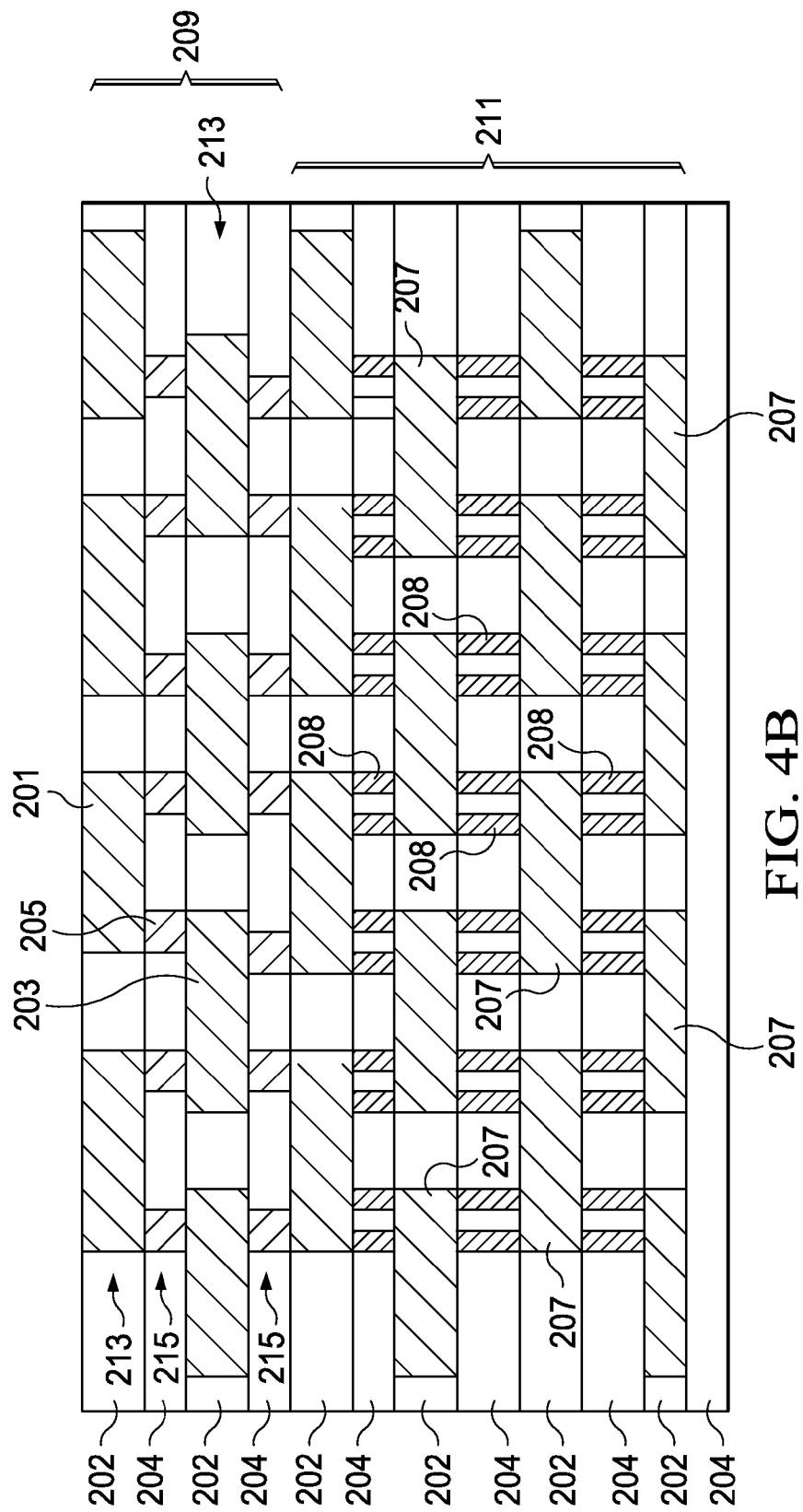

FIG. 4B illustrates a cross sectional view of FIG. 4A through line B-B'. In this embodiment there is a repeating offset pattern between adjacent layers, with each dummy line (including the upper layer dummy lines 213 and the lower layer dummy lines 207 in one layer being connected by either the upper layer vias 215 or lower layer vias 208 to each of the dummy lines overlied in an adjacent layer. For example, the second dummy line 203 may be offset from an adjacent lower layer dummy line 207, but also be aligned with the lower layer dummy line 207 opposite the adjacent lower layer dummy line 207 from the second dummy line 203.

In this embodiment, similar to the previous embodiments, the upper layer vias 215 may have larger dimensions than the lower layer vias 208. Accordingly, the upper layer vias 215 may be shaped as a single square via (as also illustrated by the first via 205 on FIG. 4A) with a side length of between about 0.1 µm and about 3 µm, such as a side length of about 0.4 µm. The lower layer vias 208, however, may comprise an array of smaller vias, such as a 2×2 array of lower layer vias 208, each lower layer via 208 having a side length of between about 0.03 µm and about 0.5 µm, such as a side length of about 0.12 µm.

Embodiments of the present invention allow the dummy metal structures to enhance the strength of the individual layers. With this added additional strength, the individual layers are able to withstand more of the stresses applied to them prior to the individual layers delaminating. By reducing the delamination, damage to the individual dies may be reduced, thereby increasing the overall yield of the production process.

Although the present invention and its advantages have been described in detail, it should be understood that various changes, substitutions and alterations can be made herein without departing from the spirit and scope of the invention as defined by the appended claims. For example, the shapes of the dummy lines may vary greatly from the shapes disclosed. As another example, it will be readily understood by those skilled in the art that the processes used to form the dummy metal structures may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a substrate comprising a scribe region;
   a plurality of conductive layers and dielectric layers over the substrate, the plurality of conductive layers and dielectric layers comprising an upper area and a lower area; and
   a dummy structure located within the plurality of conductive layers, the dummy structure comprising:
      a plurality of dummy lines, wherein at least one of the plurality of dummy lines is in the shape of a square with a square extension extending from one corner, each of the plurality of dummy lines being located in a separate conductive layer, a first one of the plurality of dummy lines being located in the upper area and a second one of the first plurality of dummy lines being located in the lower area; and
      one or more vias connecting individual ones of the plurality of dummy lines to at least one other dummy line in a separate conductive layer;
   wherein the first one of the plurality of dummy lines has a larger dimension than the second one of the plurality of dummy lines.

2. The semiconductor device of claim 1, wherein individual ones of the plurality of dummy lines in one conductive layer are laterally offset from underlying individual ones of the plurality of dummy lines in an adjacent conductive layer.

3. The semiconductor device of claim 1, wherein a first one of the one or more vias is located in the upper area, a second one of the one or more vias is located in the lower area, and the first one of the one or more vias has a larger dimension than the second one of the one or more vias.

4. The semiconductor device of claim 1, wherein a larger number of vias is connected to the second one of the plurality of dummy lines than to the first one of the plurality of dummy lines.

5. The semiconductor device of claim 2, wherein the one or more vias connect at least one of the plurality of dummy lines to two of the plurality of dummy lines, the two of the plurality of dummy lines being located in different conductive layers from each other.

6. The semiconductor device of claim 2, wherein the one or more vias connect at least one dummy line to four dummy lines, the four dummy lines being located in the same conductive layer.

7. A semiconductor device comprising:
   a plurality of semiconductor dies on a wafer;
   a scribe region located between a first semiconductor die and a second semiconductor die of the plurality of semiconductor dies, the scribe region comprising at least a first conductive layer and a second conductive layer;
   a first plurality of dummy lines located in a first array in the first conductive layer, wherein the first array extends across the scribe region and wherein the first plurality of dummy lines are located wholly within the scribe region between the first semiconductor die and the second semiconductor die, wherein the first plurality of dummy lines is in the shape of a square with a square extension extending from one corner;
   a second plurality of dummy lines located in a second array in the second conductive layer, wherein the second plurality of dummy lines is laterally offset from the first plurality of dummy lines; and
   at least one via extending from individual ones of the first plurality of dummy lines to individual ones of the second plurality of dummy lines.

8. The semiconductor device of claim 7, further comprising a third plurality of dummy lines located in a third conductive layer different from the first conductive layer and the second conductive layer, wherein at least one of the first plurality of dummy lines overlies at least one of the third plurality of dummy lines but is not connected to the at least one of the third plurality of dummy lines.

9. The semiconductor device of claim 7, wherein at least one of the first plurality of dummy lines overlies four of the second plurality of dummy lines, and the at least one via comprises a plurality of vias that extend from the at least one of the first plurality of dummy lines to the four of the second plurality of dummy lines.

10. The semiconductor device of claim 7, further comprising:
    a third conductive layer in the scribe region, the third conductive layer being located in an upper area of the die and the first conductive layer and the second conductive layer being located in a lower area of the die;
    a third plurality of dummy lines located in a third array in the third conductive layer; and
    at least one via extending from individual ones of the third plurality of dummy lines, the at least one via extending from individual ones of the third plurality of dummy lines having a larger dimension than the at least one via extending from individual ones of the first plurality of dummy lines.

11. The semiconductor device of claim 7, further comprising:
    a third conductive layer in the scribe region, the first conductive layer, the second conductive layer, and the third conductive layer being in adjacent conductive layers and the third conductive layer being opposite the second conductive layer from the first conductive layer; and
    a third plurality of dummy lines located in a third array in the third conductive layer, at least one of the third plurality of dummy lines aligned with at least one of the first plurality of dummy lines.

12. A method for forming a semiconductor device, the method comprising:
    providing a substrate with a scribe region; and
    forming an array of dummy structures over the scribe region, wherein forming each dummy structure comprises:
       forming a first plurality of dummy lines over the scribe region, individual ones of the first plurality of dummy lines located at different distances from the substrate and laterally offset from adjacent ones of the first plurality of dummy lines in a first direction and a second direction perpendicular to the first direction, wherein the first direction and second direction are parallel with a major surface of the substrate; and forming one or more vias between individual ones of the first plurality of dummy lines.

13. The method of claim 12, wherein the one or more vias located furthest from the substrate have a larger dimension than the one or more vias located closest to the substrate.

14. The method of claim 12, wherein individual ones of the first plurality of dummy lines are in the shape of a square with a square extension extending from one corner.

15. The method of claim 12, wherein a first dummy line in a first dummy structure overlies a second dummy line in a second dummy structure, and at least one via connects the first dummy line and the second dummy line.

16. The method of claim 12, wherein a first dummy line in a first dummy structure overlies a second dummy line in a second dummy structure, and the first dummy line is not connected to the second dummy line.

17. The method of claim 12, wherein the one or more vias connect a first dummy line to at least four separate dummy lines, the four separate dummy lines being located the same distance from the substrate.

18. The method of claim 14, wherein the one or more vias is formed to extend from the square extension.

* * * * *